(12) United States Patent
Yang et al.

(10) Patent No.: US 12,116,693 B2
(45) Date of Patent: Oct. 15, 2024

(54) CYLINDER ASSEMBLY FOR IMPROVING REGION OF DEFECT-FREE GROWTH OF CRYSTAL INGOT FOR SINGLE CRYSTAL PULLING APPARATUS AND SINGLE CRYSTAL PULLING APPARATUS

(71) Applicants: Xi'an ESWIN Material Technology Co., Ltd., Xi'an (CN); Xi'an ESWIN Silicon Wafer Technology Co., Ltd., Xi'an (CN)

(72) Inventors: Wenwu Yang, Xi'an (CN); Bokcheol Sim, Xi'an (CN)

(73) Assignees: XI'AN ESWIN MATERIAL TECHNOLOGY CO., LTD., Xi'an (CN); XI'AN ESWIN SILICON WAFER TECHNOLOGY CO., LTD., Xi'an (CN)

( * ) Notice: Subject to any disclaimer, the term of this patent is extended or adjusted under 35 U.S.C. 154(b) by 99 days.

(21) Appl. No.: 17/786,794

(22) PCT Filed: Jul. 23, 2021

(86) PCT No.: PCT/CN2021/108162
§ 371 (c)(1),
(2) Date: Jun. 17, 2022

(87) PCT Pub. No.: WO2022/048341
PCT Pub. Date: Mar. 10, 2022

(65) Prior Publication Data
US 2023/0013467 A1    Jan. 19, 2023

(30) Foreign Application Priority Data
Sep. 2, 2020    (CN) .......................... 202010909017.4

(51) Int. Cl.
*C30B 35/00*    (2006.01)
*C30B 15/14*    (2006.01)
*C30B 29/06*    (2006.01)

(52) U.S. Cl.
CPC .............. *C30B 15/14* (2013.01); *C30B 35/00* (2013.01); *C30B 29/06* (2013.01)

(58) Field of Classification Search
CPC ....... C30B 15/14; C30B 15/20; C30B 15/203; C30B 15/206; C30B 29/00; C30B 29/02; C30B 29/06; C30B 35/00
(Continued)

(56) References Cited

U.S. PATENT DOCUMENTS 5,373,805 A    12/1994   Takano et al.
5,824,152 A *  10/1998   Kubota ................... C30B 15/14
                                                               117/34
(Continued)

FOREIGN PATENT DOCUMENTS

CN    110573661 A    12/2019
CN    211112314 U     7/2020
(Continued)

OTHER PUBLICATIONS

Japanese Office Action corresponding to Japanese Patent Application No. 2022542058, dated Aug. 8, 2023. (2 pages).
(Continued)

*Primary Examiner* — Kenneth A Bratland, Jr.
(74) *Attorney, Agent, or Firm* — Maginot, Moore & Beck LLP

(57) ABSTRACT

A cylinder assembly of a single crystal pulling apparatus and a single crystal pulling apparatus are provided in the present disclosure. The cylinder assembly includes an inner cylinder, an outer cylinder, an annular plate and a sleeve. The inner cylinder has a shape of inverted conical. An upper end of the inner cylinder is connected to an upper end of the outer cylinder. A lower end of the outer cylinder is hermetically connected to an outer edge of the annular plate. A lower end of the inner cylinder is fixedly connected to an upper surface of the annular plate. The sleeve passes through and is fixed in an annular opening of the annular plate.

8 Claims, 3 Drawing Sheets

(58) Field of Classification Search
USPC .......... 117/11, 13, 200, 206, 208, 217, 928, 117/931–932
See application file for complete search history.

(56) References Cited

U.S. PATENT DOCUMENTS

| | | | | |
|---|---|---|---|---|
| 6,482,263 | B1* | 11/2002 | Ferry | ............. C30B 15/14 |
| | | | | 117/900 |
| 2020/0027732 | A1* | 1/2020 | Ogawa | ............. H01L 21/02381 |
| 2022/0356598 | A1* | 11/2022 | Yang | ............. C30B 29/06 |

FOREIGN PATENT DOCUMENTS

| | | | |
|---|---|---|---|
| CN | 111876823 | A | 11/2020 |
| CN | 215163293 | U | 12/2021 |
| DE | 112021000109 | T5 | 6/2022 |
| JP | H05884 | A | 1/1993 |
| JP | H11255576 | A | 9/1999 |
| JP | 2000247776 | A | 9/2000 |
| JP | 2004352581 | A | 12/2004 |
| JP | 2005060151 | A | 3/2005 |
| JP | 2005231969 | A | 9/2005 |
| JP | 2007314375 | A | 12/2007 |
| JP | 2010018446 | A | 1/2010 |
| KR | 20020045765 | A | 6/2002 |
| KR | 20060057140 | A | 5/2006 |
| KR | 20060101453 | A | 9/2006 |
| KR | 100869940 | B1 | 11/2008 |
| KR | 20090062144 | A | 6/2009 |
| KR | 20190108613 | A | 9/2019 |

OTHER PUBLICATIONS

English Translation of Japanese Office Action corresponding to Japanese Patent Application No. 2022542058, dated Aug. 8, 2023. (2 pages).
Korean Office Action corresponding to Korean Application No. 10-2021-7037381, dated Jun. 20, 2023. (5 Pages).
English Translation of Korean Office Action corresponding to Korean Application No. 10-2021-7037381, dated Jun. 20, 2023. (6 Pages).
Machine English Translation of KR20090062144A. (10 Pages).
Machine English Translation of JP2000247776A. (20 Pages).
Machine English Translation of JP2004352581A. (11 Pages).
Machine English Translation of JP2007314375A. (14 Pages).
Written Opinion and International Search Report of the International Search Authority corresponding to International Application No. PCT/CN2021/108162, dated Sep. 28, 2021. (9 pages).
English Translation of Written Opinion and International Search Report of the International Search Authority corresponding to International Application No. PCT/CN2021/108162, dated Sep. 28, 2021. (4 pages).
Machine English Translation of JP2010018446A. (14 Pages).
Machine English Translation of CN211112314U. (13 Pages).
Chinese Office Action corresponding to Chinese Patent Application No. 202010909017.4, dated Apr. 24, 2024. (8 pages).
English Translation of Chinese Office Action corresponding to Chinese Patent Application No. 202010909017.4, dated Apr. 24, 2024. (4 pages).
German Office Action corresponding to German Application No. 11 2021 004 653.5, dated Apr. 4, 2024. (5 Pages).
English Translation of German Office Action corresponding to German Application No. 11 2021 004 653.5, dated Apr. 4, 2024. (6 Pages).
Machine English Translation of JPH05884A. (4 Pages).
Machine English Translation of KR100869940B1. (7 Pages).
Zhao, Ping, Jian Sheng, and Hua Zhang. "Characteristics of the Initial Stage of CaCO3 Crystallization Fouling on Straight Oblique Fin Tube." Advanced Materials Research 671 (2013): 2535-2541.
Hao, Guo et al. "Design of Thermal Field for 6-inch Low Dislocation Germanium Single Crystal Growth." in The 46th Research Institute of China Electronics Technology Group Corporation (2021): 10.16553/j.cnki.issn1000-985x.2021.06.001.
Machine English Translation of KR20060057140A. (15 Pages).
Machine English Translation of KR20060101453A. (15 Pages).
Machine English Translation of CN111876823A. (9 Pages).
Machine English Translation of CN215163293U. (11 Pages).
Machine English Translation of JP2005060151A. (21 Pages).
Machine English Translation of JP2005231969A. (14 Pages).
Machine English Translation of JPH11255576A. (11 Pages).
Machine English Translation of KR20020045765A. (9 Pages).

* cited by examiner

CYLINDER ASSEMBLY FOR IMPROVING REGION OF DEFECT-FREE GROWTH OF CRYSTAL INGOT FOR SINGLE CRYSTAL PULLING APPARATUS AND SINGLE CRYSTAL PULLING APPARATUS

CROSS-REFERENCE TO RELATED APPLICATION

This application is the U.S. national phase of PCT Application No. PCT/CN2021/108162 filed on Jul. 23, 2021, which claims priority to Chinese Patent Application No. 202010909017.4 filed on Sep. 2, 2020, the disclosures of which are incorporated in their entirety by reference herein.

TECHNICAL FIELD

The present disclosure relates to the preparation of an ingot, in particular to a cylinder assembly of a single crystal pulling apparatus and a single crystal pulling apparatus.

BACKGROUND

With continuous improvement of manufacturing process of microelectronics industry, there are higher requirements for quality of silicon wafer, and good quality means it is necessary to control crystal defects in an ingot. There mainly exist two kinds of crystal defects in the ingot. One is a defect formed by aggregation of supersaturated interstitial. This kind of defects does not affect a gate oxide integrity (GOI) of a Metal Oxide Semiconductor (MOS) device. The other is a defect formed by aggregation of vacancies. This kind of growth defects affect greatly the product yield related to GOI. Common vacancy defects includes Crystal Originated Particles (COPs), Flow Pattern Defects (FPDs), and Laser Scattering Tomography Defects (LSTDs) and so on. The generation of such defects is related to an axial temperature gradient G of the crystal ingot, and the axial temperature gradient G may be adjusted according to a design of a Hot-Zone.

Design of a heat shield in the Hot-Zone is crucial, which directly affects the axial temperature gradient G of the crystal ingot and a gradient difference ΔG between an axial temperature gradient at an edge of the crystal ingot and an axial temperature gradient at a center of the crystal ingot, thereby affecting the kinds and the distribution of the defects in the crystal ingot. In a crystal pulling process, due to limitations of the heat shield in the prior art, a large amount of heat is transferred from a melt surface to the surface of the crystal ingot, leading to the decrease of an axial temperature gradient at the edge of the crystal ingot. However, the axial temperature gradient at the center of the crystal ingot has not been affected significantly, so that ΔG is increased. According to a V/G theory, the vacancy defects may aggregate and grows up in the meantime, which may reduce a region of defect-free growth, it is adverse to the defect-free growth of the crystal ingot.

SUMMARY

The present disclosure provides a cylinder assembly of a single crystal pulling apparatus and a single crystal pulling apparatus, which may solve a problem that a heat shield structure in the prior art may not well adjust an axial temperature gradient of a crystal ingot and a gradient between an axial temperature gradient at an edge of the crystal ingot and an axial temperature gradient at a center of the crystal ingot, it is adverse to the defect-free growth of the crystal ingot.

In order to solve the above technical problems, the following solution is provided in the present disclosure.

In one aspect, the present disclosure provides in some embodiments a cylinder assembly of a single crystal pulling apparatus, including an inner cylinder, an outer cylinder, an annular plate and a sleeve. The inner cylinder is inverted conical. An upper end of the inner cylinder is connected to an upper end of the outer cylinder. A lower end of the outer cylinder is hermetically connected to an outer edge of the annular plate. A lower end of the inner cylinder is fixedly connected to an upper surface of the annular plate. The sleeve is fixedly inserted in an annular opening of the annular plate.

In a possible embodiment of the present disclosure, the inner cylinder and the outer cylinder are made of graphite.

In a possible embodiment of the present disclosure, the annular plate is made of molybdenum.

In a possible embodiment of the present disclosure, the sleeve is made of quartz.

In a possible embodiment of the present disclosure, a first filler and a second filler are filled in a chamber formed by the inner cylinder, the outer cylinder and the annular plate. The first filler is located above the second filler. The first filler is made of thermally conductive material. The second filler is made of thermally insulating material.

In a possible embodiment of the present disclosure, the sleeve has a shape of hollow cylinder. A first flange is formed on an outer wall of the sleeve. The first flange is hermetically lapped on an upper surface of the annular plate.

In a possible embodiment of the present disclosure, a lower end of the sleeve extends from a bottom of the annular plate. The lower end of the sleeve is provided with a second flange extending outwardly in radial directions.

In a possible embodiment of the present disclosure, the outer edge of the annular plate is provided with a first thread. The lower end of the outer cylinder is provided with a second thread. The annular plate is connected with the outer cylinder threadedly by the first thread and the second thread.

In another aspect, the present disclosure also provides in some embodiments a single crystal pulling apparatus, including the above-mentioned cylinder assembly.

The present disclosure has the following beneficial effects.

According to the embodiments of the present disclosure, in the condition of keeping a stable solid-liquid-gas triple point of a silicon melt, the cylinder assembly ensures that an inert gas sweeps across a surface of the silicon melt in an orderly and stable manner, takes away silicon monoxide gas, and transfers a part of heat of the silicon melt to a surface of the crystal ingot, so as to reduces an axial temperature gradient at the edge of a lower end of the crystal ingot, thereby reducing a difference between an axial temperature gradient at the edge and an axial temperature gradient at the center, making it close to an ideal value, and facilitating the defect-free growth of the crystal ingot. An upper end of the crystal ingot is rapidly cooled, so that the crystal ingot quickly passes through a temperature range at which defect generates and grows, and finally a high-quality crystal ingot is produced.

DETAILED DESCRIPTION

To describe the objectives, the technical solutions and the characteristics of embodiments of the present disclosure more clearly, the technical solutions of embodiments of the present disclosure are described clearly and completely in conjunction with drawings of the embodiments of the present disclosure. Apparently, the described embodiments are merely a part of rather than all embodiments of the present disclosure. All other embodiments obtained by a person of ordinary skill in the art based on the described embodiments of the present disclosure, shall fall within the scope of the present disclosure.

Figure 1:
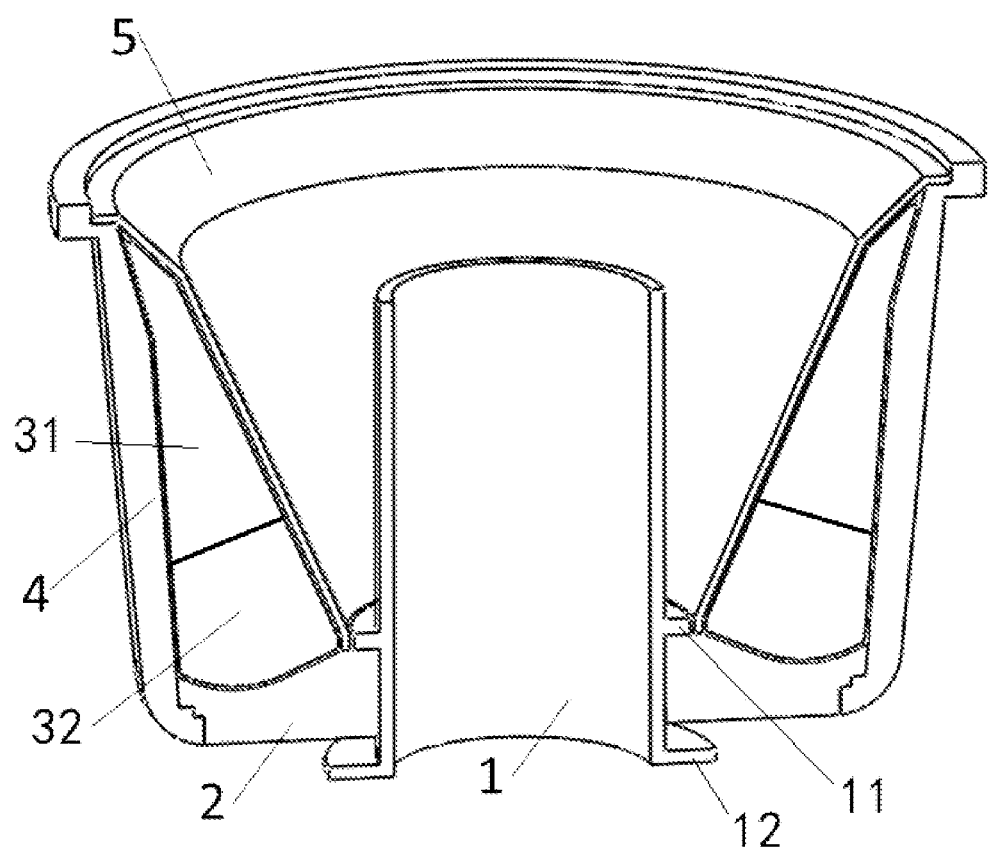
FIG. 1 is a schematic structural diagram of a cylinder assembly according to an embodiment of the present disclosure.
Figure 2:
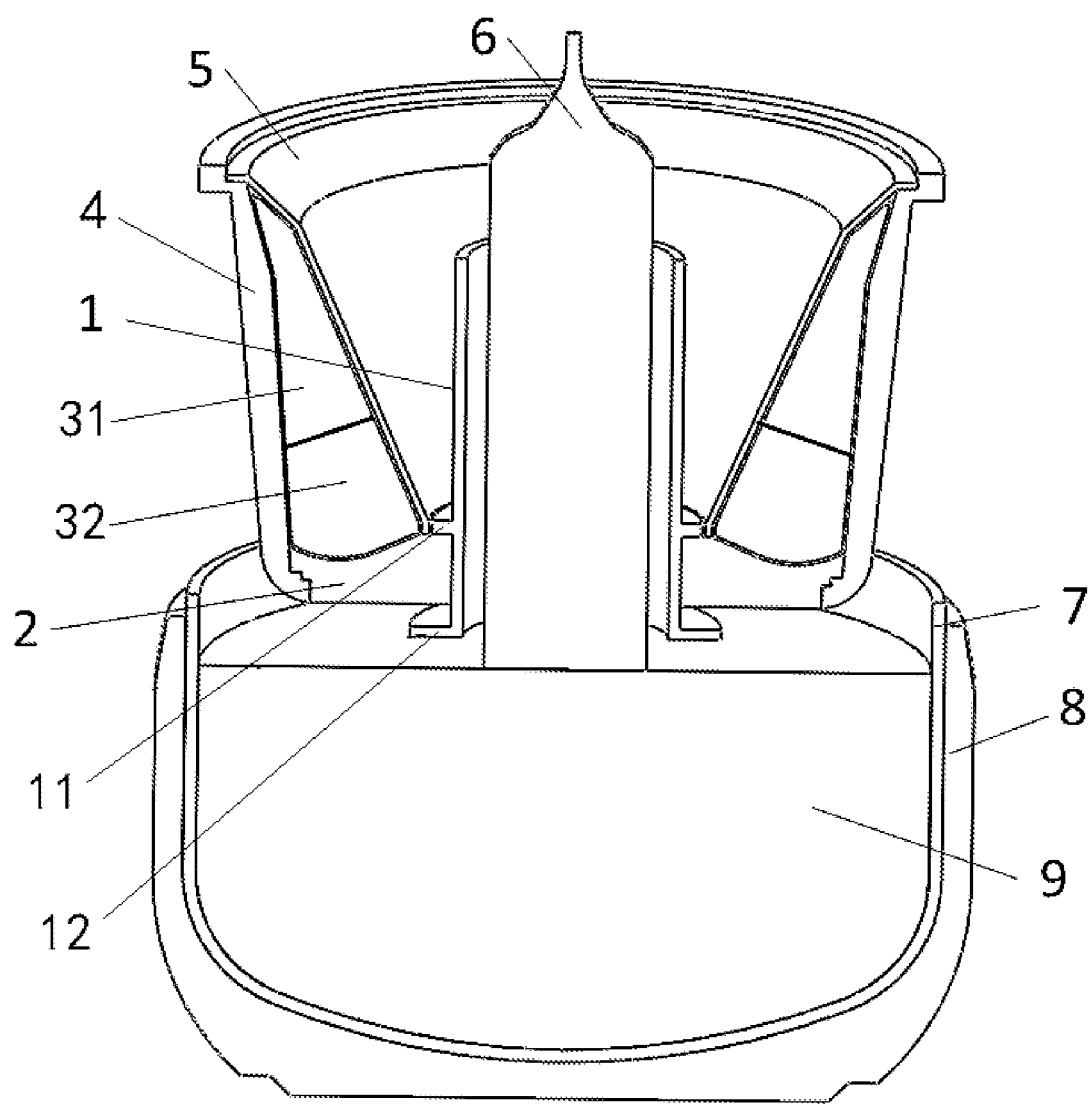
FIG. 2 is a schematic structural diagram of a single crystal pulling apparatus according to an embodiment of the present disclosure.

Referring to FIGS. 1 to 2, FIG. 1 is a schematic structural diagram of a cylinder assembly provided in one embodiment of the present disclosure, and FIG. 2 shows a schematic structural diagram of a single crystal pulling apparatus provided in one embodiment of the present disclosure. As shown in FIGS. 1 and 2, the cylinder assembly in the present disclosure includes a sleeve 1, an annular plate 2, an outer cylinder 4 and an inner cylinder 5. The outer cylinder 4 is hollow, provided with openings at two ends, and arranged on the periphery of the inner cylinder 5. —Specifically, an upper end of the inner cylinder 5 is connected with an upper end of the outer cylinder 4. The upper end of the inner cylinder 5 is slightly smaller than an opening of the upper end of the outer cylinder 4 to ensure that the inner cylinder 5 can be fitted in the outer cylinder 4. The upper end of the inner cylinder 5 may be lapped on or threadedly connected to the upper end of the outer cylinder 4, which is not limited here. A lower end of the outer cylinder 4 is hermetically connected to an outer edge (i.e. an outer periphery) of the annular plate 2. A lower end of the inner cylinder 5 is fixedly connected to an upper surface of the annular plate 2. The inner cylinder 5 has a shape of inverted conical, and the contact point between the lower end of the inner cylinder 5 and the upper surface of the annular plate 2 is close to an inner edge of the annular plate 2. The sleeve 1 is fixedly inserted in an annular opening of the annular plate 2. Most part of the sleeve 1 is located in an inner cavity of the inner cylinder 5, and a lower end of the sleeve 1 extends beyond the bottom of the annular plate 2. An outer diameter of the sleeve 1 matches a diameter of the annular opening of the annular plate 2, so that a good sealing effect can be achieved therebetween.

In the embodiment of the present disclosure, the outer edge of the annular plate 2 is provided with a first thread, the lower end of the outer cylinder 4 is provided with a second thread, and the annular plate 2 and the outer cylinder 4 are connected threadedly by the first thread and the second thread. By means of the thread fit connection, it is convenient to detach the sleeve 1 from the outer cylinder 4, and in addition, a tight connection is achieved to avoid loosening under blowing of the inert gas.

In the embodiment of the present disclosure, the sleeve 1 has a shape of hollow cylinder, a first flange 11 is formed on an outer wall of the sleeve 1, and the first flange 11 is hermetically lapped on an upper surface of the annular plate 2 to achieve sealed and fixed connection, so that the inert gas could only enter the sleeve 1 from an upper opening of the sleeve 1, flow through a gap between the sleeve 1 and a crystal ingot 6, and finally flow from a lower opening of the sleeve 1 to a surface of a silicon melt 9, and take away silicon monoxide gas formed on the surface of the silicon melt 9 to prevent the silicon monoxide gas from adversely affecting quality of the crystal ingot 6. In the prior art, a heat shield is inverted conical, which may damages flow stability of the inert gas and may leads to turbulence. The inert gas may not fully contact the crystal ingot, which weakens the cooling effect of the inert gas. Compared with the inverted conical heat shield in the prior art, the sleeve 1 in the embodiment of the present invention has a shape of hollow cylinder, which ensures a vertical flow stability of the inert gas. While ensuring that heat of the crystal ingot 6 is rapidly released, the inert gas may flow through the gap between the crystal ingot 6 and an inner wall of the sleeve 1, and fully contact the surface of the crystal ingot 6, increasing the cooling rate of the crystal ingot 6, and at the same time the crystal pulling speed is increased and time cost can be reduced.

Compared with a heat shield made of graphite in the prior art, the sleeve 1 in the embodiment of the present disclosure is made of quartz. A lower end of the sleeve 1 extends beyond a bottom of the annular plate 2, and the lower end of the sleeve 1 is provided with a second flange 12 extending outwardly in radial directions. When the inert gas flows out from the lower opening of the sleeve 1, the second flange 12 may ensure that the inert gas sweeps across the surface of the silicon melt 9 in an orderly and stable manner and takes away the silicon monoxide gas, so that a position of a solid-liquid-gas triple point is maintained, a part of heat of the silicon melt 9 is transferred to the lower end of the crystal ingot 6, an axial temperature gradient at the edge of the lower end of the crystal ingot 6 is increased, and a difference ΔG between the axial temperature gradient at the edge of the crystal ingot 6 and an axial temperature gradient at the center of the crystal ingot 6 is reduced, thereby making the difference ΔG close to an ideal value. A defect-free region in the crystal ingot 6 is longitudinally enlarged as much as possible, and the quality of the crystal ingot 6 is adequately improved.

In the embodiment of the present disclosure, the annular plate 2 is made of reflective thermal insulation material. Specifically, the annular plate 2 is made of molybdenum. According to the above content, an inside of the annular opening of the annular plate 2 may be insulated from temperature variety, the position of the solid-liquid-gas triple point of the silicon melt 9 may be kept stable, and a stability of a temperature field may be maintained. The annular plate 2 made of molybdenum may effectively reflect heat from a melt surface and facilitate to stabilize a temperature field of the surface and a periphery area of the silicon melt 9. The annular plate 2 made of molybdenum may also keep a constant temperature of a part of the crystal ingot 6 when passing through thereof. A stable temperature field is formed at a corresponding height position of the sleeve 1, so as to ensure a constant axial temperature gradient G of the crystal ingot 6, increase the temperature of the lower end of the crystal ingot 6, and facilitate a defect-free growth of the crystal ingot 6 at the height position.

In the embodiment of the present disclosure, the inner cylinder 5 and the outer cylinder 4 is made of thermally conductive material. Specifically, the inner cylinder 5 and the outer cylinder 4 are made of graphite. The inner cylinder 5 and the outer cylinder 4 made of thermally conductive material may facilitate the crystal ingot 6 located inside the inner cylinder 5 to quickly cool down at the certain height position, that is, the heat from the part of the crystal ingot 6 located inside the inner cylinder 5 is quickly dissipated outwardly through the inner cylinder 5 and the outer cylinder 4, so that the crystal ingot 6 quickly passes through a temperature range at which defect generates and grows up. Growth of defects in the crystal ingot 6 is effectively suppressed, thereby reducing the growth of defects in the crystal ingot 6.

In the embodiment of the present disclosure, a filler is filled in a chamber formed by the inner cylinder 5, the outer cylinder 4 and the annular plate 2. The filler includes a first filler 31 and a second filler 32. The first filler 31 is located above the second filler 32. The first filler 31 is made of thermally conductive material, and the second filler 32 is made of thermally insulating material. The chamber formed by the inner cylinder 5, the outer cylinder 4 and the annular plate 2 is divided into two parts. An upper part is filled with the first filler 31. Since the crystal ingot 6 at the upper part needs to be quickly cooled down, the first filler 31 is made of thermally conductive material, together with the inner cylinder 5 and the outer cylinder 4 made of graphite, such that heat of the crystal ingot 6 can be quickly transferred to the outside. A lower part is filled with the second filler 32. Since the crystal ingot 6 at the lower part needs to keep a constant temperature, the second filler 32 is made of the thermally insulating material. The second filler 32 may block heat transfer from the bottom to the top, and also block heat transfer from the inside to the outside, so as to reduce heat dissipation.

In the embodiment of the present disclosure, in one aspect, the annular plate 2 made of molybdenum may keep the temperature of the part of the crystal ingot 6 passing through it constant, increase the temperature of the lower end of the crystal ingot 6, and generate the stable temperature field at the corresponding height position of the sleeve 1. In another aspect, by making the inner cylinder 5 and the outer cylinder 4 made of thermally conductive material, and filling the thermally conductive material and thermally insulating material inside them, a temperature of the crystal ingot 6 passing through an upper part of the inner cylinder 5 is rapidly reduced, thereby increasing the axial temperature gradient G of the crystal ingot 6, so a region where crystal ingot 6 growth with defect-free is larger.

Figure 3:
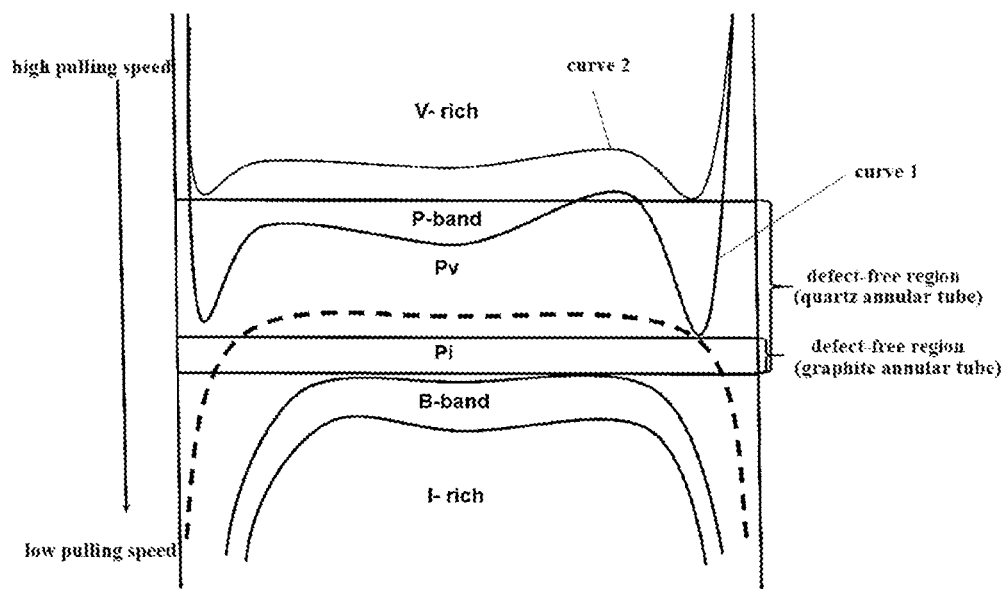
FIG. 3 is a distribution diagram of crystal defects on a longitudinal section plane of a crystal ingot according to an embodiment of the present disclosure.

Referring to FIG. 3, FIG. 3 is a distribution diagram of crystal defects on a longitudinal section plane of a crystal ingot provided in an embodiment of the present disclosure. As shown in FIG. 3, when the crystal ingot grows in a condition of high speed pulling, a vacancy cluster or a vacancy region is formed by vacancies, which is a vacancy-type defect region (v-rich region). A region of crystal original oxide particles (P band) is formed by reducing the pulling speed V, which may be manifested in a form of annular oxidation induced stacking fault (OiSF) after a specific oxidative heat treatment. In the case that the pulling speed V is further reduced, a crystal region where there are oxygen precipitates and no original defects are detected is an oxygen precipitation promotion region (Pv). Further, a crystal region where oxygen precipitation is not prone to generate and no original defects are detected is an oxygen precipitation suppression region (Pi). In the case that the pulling speed is further reduced, a small amount of interstitial silicon atoms aggregate to form small self-interstitial silicon clusters (B band). At a lower pulling speed, a crystal region where large dislocation clusters are detected is a dislocation cluster region, that is an interstitial defect region (I rich region). Curve 1 in FIG. 3 shows a distribution of vacancy-type defects in the prior art where a sleeve/cylinder made of graphite is added. It can be seen that the curve 1 varies largely, and the two ends protrude significantly downwards, which makes defect-free region of the crystal ingot significantly reduced. At the same time, vacancy defects may generate at the edge of the crystal ingot, which is not conducive to a defect-free growth of the crystal ingot. Curve 2 in FIG. 3 shows a distribution of vacancy-type defects where the sleeve 1 made of quartz according to the embodiment of the present disclosure is added. It can be seen that, after the sleeve 1 made of quartz in the embodiment of the present disclosure is adopted, the curve 2 tends to be flat, and protrusions at both ends are significantly reduced, thereby the defect-free region of the crystal ingot is extended and the quality of the crystal ingot is adequately improved.

According to embodiments of the present disclosure, while keeping a stable solid-liquid-gas triple point of a silicon melt, the cylinder assembly is capable of ensuring that an inert gas sweeps across a surface of the silicon melt in an orderly and stable manner, takes away silicon monoxide gas, and transfers a part of heat of the silicon melt to a surface of the crystal ingot, so as to reduces an axial temperature gradient at the edge of a lower end of the crystal ingot, thereby reducing a difference between an axial temperature gradient at the edge and an axial temperature gradient at the center, making it close to an ideal value, and facilitating the defect-free growth of the crystal ingot. An upper end of the crystal ingot is rapidly cooled, so that the crystal ingot quickly passes through a temperature range at which defect generates and grows up, and finally a high-quality crystal ingot is produced.

In another aspect, the present disclosure provides in some embodiments a single crystal pulling apparatus. The single crystal pulling apparatus includes the cylinder assembly described in the above embodiments. While keeping a solid-liquid-gas triple point of a silicon melt stable, the cylinder assembly in some embodiments of the present disclosure ensures that an inert gas sweeps across a surface of the silicon melt in an orderly and stable manner, takes away silicon monoxide gas, and transfers a part of heat of the silicon melt to a surface of the crystal ingot, so as to reduces an axial temperature gradient at the edge of a lower end of the crystal ingot, thereby reducing a difference between an axial temperature gradient at the edge and an axial temperature gradient at the center, making it close to an ideal value, and facilitating the defect-free growth of the crystal ingot. An upper end of the crystal ingot is rapidly cooled, so that the crystal ingot quickly passes through a temperature range at which defect generates and grows up, and finally a high-quality crystal ingot is produced. The single crystal pulling apparatus in the embodiment of the present disclosure also has the above-mentioned beneficial effects, and in order to avoid repetition, details are not described herein again.

As shown in FIG. 2, in a possible embodiment of the present disclosure, the single crystal pulling apparatus includes a crucible assembly and a cylinder assembly arranged above the crucible assembly. The crucible assembly includes a graphite crucible 8 and a quartz crucible 7. The crucible assembly contains silicon melt 9, and the cylinder assembly is at a certain height from a surface of the silicon melt 9. A diameter of the sleeve 1 is slightly larger than a diameter of the crystal ingot 6 to allow the crystal ingot 6 to pass through thereof.

The foregoing descriptions are some embodiments of the present disclosure. Obviously, a person skilled in the art may make further modifications and improvements without departing from the principle of the present disclosure, and these modifications and improvements shall also fall within the protection scope of the present disclosure.

What is claimed is:

1. A cylinder assembly of a single crystal pulling apparatus, comprising: an inner cylinder, an outer cylinder, an annular plate and a sleeve, wherein the inner cylinder is inverted conical, an upper end of the inner cylinder is connected to an upper end of the outer cylinder, a lower end of the outer cylinder is hermetically connected to an outer edge of the annular plate, a lower end of the inner cylinder is fixedly connected to an upper surface of the annular plate, and the sleeve is fixedly inserted in an annular opening of the annular plate;

wherein the sleeve has a shape of hollow cylinder, a first flange is formed on an outer wall of the sleeve, and the first flange is hermetically lapped on an upper surface of the annular plate.

2. The cylinder assembly according to claim 1, wherein the inner cylinder and the outer cylinder are made of graphite.

3. The cylinder assembly according to claim 1, wherein the annular plate is made of molybdenum.

4. The cylinder assembly according to claim 1, wherein the sleeve is made of quartz.

5. The cylinder assembly according to claim 1, wherein a first filler and a second filler are filled in a chamber formed by the inner cylinder, the outer cylinder and the annular plate, the first filler is located above the second filler, the first filler is made of thermally conductive material, and the second filler is made of thermally insulating material.

6. The cylinder assembly according to claim 1, wherein a lower end of the sleeve extends from a bottom of the annular plate, and the lower end of the sleeve is provided with a second flange extending outwardly in radial directions.

7. The cylinder assembly according to claim 1, wherein the outer edge of the annular plate is provided with a first thread, the lower end of the outer cylinder is provided with a second thread, and the annular plate and the outer cylinder are connected threadedly by the first thread and the second thread.

8. A single crystal pulling apparatus, comprising the cylinder assembly according to claim 1.

* * * * *